(12) United States Patent
Suga et al.

(10) Patent No.: US 6,426,021 B2
(45) Date of Patent: Jul. 30, 2002

(54) ANISOTROPICALLY ELECTROCONDUCTIVE ADHESIVE MATERIAL AND CONNECTING METHOD

(75) Inventors: Yasuhiro Suga; Motohide Takeichi, both of Kanuma (JP)

(73) Assignee: Sony Chemicals Corp., Tokyo (JP)

(*) Notice: Subject to any disclaimer, the term of this patent is extended or adjusted under 35 U.S.C. 154(b) by 0 days.

(21) Appl. No.: 09/809,279

(22) Filed: Mar. 16, 2001

(30) Foreign Application Priority Data

Mar. 31, 2000 (JP) ......................................... 2000-099883

(51) Int. Cl.$^7$ .............................. H01B 1/02; H01L 23/29
(52) U.S. Cl. ........................ 252/513; 257/789; 257/795
(58) Field of Search .......................... 252/513; 257/789, 257/795

(56) References Cited

U.S. PATENT DOCUMENTS 5,965,064 A * 10/1999 Yamada et al. ............. 252/512
6,020,059 A * 2/2000 Yamada et al. ............. 428/328

FOREIGN PATENT DOCUMENTS

| EP | 0 893 484 A2 | 1/1999 |
| EP | 0 914 027 A1 | 5/1999 |
| EP | 1 093 160 A2 | 4/2001 |

* cited by examiner

*Primary Examiner*—Cathy Lam
(74) *Attorney, Agent, or Firm*—Oliff & Berridge, PLC

(57) ABSTRACT

An anisotropically electroconductive adhesive material is configured of a thermosetting resin and electroconductive particles dispersed in the thermosetting resin, wherein a 10% modulus of compressive elasticity (E) in the electroconductive particles and the modulus of longitudinal elasticity (E') of the projecting electrodes of the electronic element to be connected by the anisotropically electroconductive adhesive material satisfy the below relational Formula (1)

$$0.02 \leq E/E' \leq 0/5 \tag{1}$$

5 Claims, 1 Drawing Sheet

ANISOTROPICALLY ELECTROCONDUCTIVE ADHESIVE MATERIAL AND CONNECTING METHOD

BACKGROUND OF THE INVENTION

1. Field of the Invention

The present invention relates to an anisotropically electroconductive adhesive material and to a connecting method.

2. Description of the Related Art

In recent years, bare IC chips which are furnished with gold or solder bumps as projecting electrodes have been directly flip-chip mounted on electrode pads of substrates to be IC-mounted or worked and mounted in chip size package (CSP) configurations. When chip mounting is carried out as such, an anisotropically electroconductive adhesive material in the form of a film, paste or liquid, in which an epoxy or other thermosetting resin and electroconductive particles have been compounded, is sandwiched between the projecting electrodes of the bare IC chip and the substrate to be IC-mounted, after which heat and pressure are applied thereto.

However, using gold bumps is problematic due to the extremely high cost of materials. Moreover, using solder bumps is problematic owing to the fact that when an electrolytic plating method is used to form very fine and uniform bumps, a resist step is required, and furthermore, before the solder plating is carried out, complex electrolytic plating steps are required, such as the forming of a underlying metal layer (Ti/Cu) and the forming of a metal multilayered plating barrier layer (Cu/Ni/Au).

Attempts have therefore been made to use nickel bumps, which are low in cost and which can be formed in a relatively simple electrolytic plating step.

However, the relatively high hardness of the nickel bumps when compared with gold or solder bumps means that plastic deformation occurs in the anisotropically electroconductive adhesive material because the electroconductive particles therein are crushed by the nickel bumps. This becomes problematic owing to the fact that a stable state of contact cannot be maintained between the nickel bumps of the bare IC chip and the electrode pads of the substrate to be IC-mounted, which results in diminished connection reliability.

SUMMARY OF THE INVENTION

With the foregoing problems with the prior art in view, it is an object of the present invention to provide an anisotropically electroconductive adhesive material with which it can be ensured that the same connection reliability observed in conventional anisotropically electroconductive connections which use gold or solder bumps is maintained, even when relatively hard bumps such as nickel bumps are used as projecting electrodes when effecting anisotropically electroconductive connections between electronic elements such as bare IC chips, which are furnished with projecting electrodes, and the connecting pads of wiring boards.

The present inventors perfected the present invention by discovering that the reliability of anisotropically electroconductive connections is intimately related to a 10% modulus of compressive elasticity (E) in the electroconductive particles in the anisotropically electroconductive adhesive material and the modulus of longitudinal elasticity (E') of the projecting electrodes of the electronic element, and moreover that by adjusting the ratio of E to E' over a specific range the connection reliability can be improved.

In other words, the present invention provides an anisotropically electroconductive adhesive material, comprising a thermosetting resin and electroconductive particles dispersed in the thermosetting resin, wherein a 10% modulus of compressive elasticity (E) in said electroconductive particles and a modulus of longitudinal elasticity (E') of projecting electrodes of an electronic element to be connected by said anisotropically electroconductive adhesive material satisfy the below Relational Formula (1).

$$0.02 \leq E/E' \leq 0.5 \tag{1}$$

Moreover, the present invention provides a connecting method, comprising sandwiching an anisotropically electroconductive adhesive material, in which electroconductive particles have been dispersed in a thermosetting resin, between projecting electrodes of an electronic element and the connecting pads of a wiring board, and applying heat and pressure thereto to make a connection therebetween while ensuring continuity between the electrical element and the wiring board, wherein, in the anisotropically electroconductive adhesive material, a 10% modulus of compressive elasticity (E) in the electroconductive particles and a modulus of longitudinal elasticity (E') of the projecting electrodes of the electronic element that satisfy the Relational Formula (1) below.

$$0.02 \leq E/E' \leq 0.5 \tag{1}$$

DETAILED DESCRIPTION OF THE EMBODIMENTS OF THE INVENTION

Figure 1A:
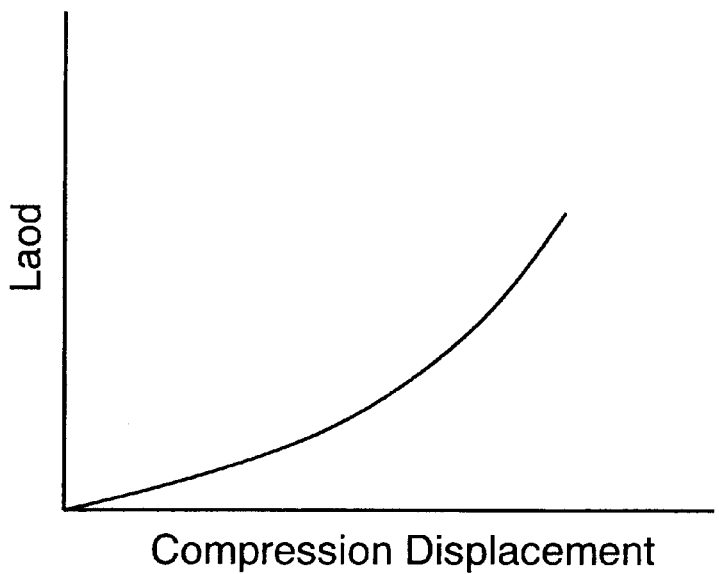
FIG. 1A and FIG. 1B, respectively, are a diagram showing the relationship between load and compression displacement and a diagram showing the relationship between compression strain and K value.

The present invention is described in detail below.

The anisotropically electroconductive adhesive material pertaining to the present invention is an adhesive material in the form of a film, paste or liquid formed through the dispersing of electroconductive particles in a thermosetting resin, which must satisfy Relational Formula (1):

$$0.02 \leq E/E' \leq 0.5 \tag{1}$$

for a 10% modulus of compressive elasticity (E) in the electroconductive particles and the modulus of longitudinal elasticity (E') of the projecting electrodes of the electronic element to be connected by the anisotropically electroconductive adhesive material. This is stipulated because when E/E' falls below 0.02, sufficient connection reliability cannot be ensured owing to the low restoring force of the electroconductive particles, and, conversely, when E/E' exceeds 0.5 the electroconductive particles are insufficiently crushed leading again to connection reliability which is insufficiently ensured.

The modulus of longitudinal elasticity (E') of the projecting electrodes can be measured with a testing method performed according to JIS Z2241. The 10% modulus of compressive elasticity (E) in the electroconductive particles corresponds to the K value defined in "Elastic Theory" on p. 42 of Landau-Liefschitz' textbook on theoretical physics (published by Tokyo Library (1972)). The K value is defined as below.

When two elastic spheres of respective radii R and R' are made to come in contact in a compressed state, then h shall be expressed according to Formulae (i) and (ii) below.

$$h = F^{2/3}[D^2(1/R+1/R')]^{1/3} \quad \text{(i)}$$

$$D = (3/4)[(1-\sigma^2)/E + (1-\sigma'^2)/E'] \quad \text{(ii)}$$

In the above formulae, h expresses the difference between R+R' and the distance between the centres of the two spheres; F expresses compressive force; E, E' respectively express the modulus of elasticity of each of the two elastic spheres and σ, σ' express the Poisson ratio of the elastic spheres.

On the other hand, if a rigid plate is substituted for one of the spheres and a compressive force is applied from both sides, then Formula (iii) can be approximated as follows, assuming that R tends towards ∞ and E is extremely greater than E'.

$$F = (2^{1/2}/3)(S^{3/2})(E \cdot R^{1/2})(1-\sigma^2) \quad \text{(iii)}$$

In the above formula, S expresses the amount of compressive deformation. Therefore, if the K value can be defined as in Formula (iv), the K value can be expressed as in Formula (v).

$$K = E/(1-\sigma^2) \quad \text{(iv)}$$

$$K = (3/\sqrt{2}) \cdot F \cdot S^{-3/2} \cdot R^{-1/2} \quad \text{(v)}$$

This K value expresses universally and quantitatively the hardness of the spheres. By using this K value (i.e., the 10% modulus of compressive elasticity (E)), it becomes possible to express quantitatively and unconditionally the ideal hardness of microspheres or spacers (referred to below as spacers). A specific method for determining the K value shall be described in detail with the aid of the examples of the present specification.

The numerical values used for the 10% modulus of compressive elasticity (E) for the electroconductive particles are generally within the range of 3 to 30 GPa, owing to the fact that when they are below this range the likelihood that the connections in the connection reliability test will be unsatisfactory is high, while when they exceed the range there are concerns stemming from continuity not being established during the initial connection, or that portions of the circuit other than the projecting electrodes will suffer damage. The numerical values used for the modulus of longitudinal elasticity (E') of the projecting electrodes of the electronic element are generally within the range of 40 to 200 GPa owing to the fact that when they are below this range the electroconductive particles will slide into the projecting electrodes during connection, leading to a poor connection, while when they exceed the range the circuit electrodes on the substrate will break under high connection pressures.

The anisotropically electroconductive adhesive material pertaining to the present invention possesses the above characteristics, but in other constitutions it can be similar to conventional anisotropically electroconductive adhesive materials.

Examples of thermosetting resins include epoxy, urethane and unsaturated polyester resins. The thermosetting resin may contain photoreactive functional groups such as acrylic acid and (meth)acrylic acid ester residues. Of these, it is preferable that a solid epoxy resin that is solid at normal temperatures is used. In such circumstances, it is also possible to combine it with a liquid epoxy resin that is liquid at normal temperatures. The compounding ratio of the liquid epoxy resin to the solid epoxy resin at normal temperatures can be suitably determined according to the performance required of the anisotropically electroconductive adhesive material when used in the form of a film. Moreover, when the degree of flexibility of a film comprising such solid or liquid epoxy resins is to be improved and it is thereby required to increase the peel strength of the anisotropically electroconductive adhesive material, it is particularly preferable to add a flexible epoxy resin to the aforedescribed epoxy resins. In such circumstances, the amount of flexible epoxy resin to be used in the anisotropically electroconductive adhesive material pertaining to the present invention is preferably 5 to 35 wt %, or more preferably 5 to 25 wt %, since any amount below this range will not allow the effect of having added the flexible epoxy resin to be sufficiently realized, while any amount in excess of this range will cause heat resistance to suffer.

Electroconductive particles to be used in the present invention can be suitably selected from materials conventionally used in anisotropically electroconductive adhesive materials so as to satisfy the aforesaid Formula (1). Examples of particles which can be used include metallic particles such as solder and nickel, a metal-covered resin particles, in which a metal plating coating has been formed on the surface of a core resin sych as polystyrene, or complex particles in which silica or another inorganic powder is bonded to the resin core surface by hybridisation, and then a metal plating coating is applied thereon.

The mean particle size of the electroconductive particles can be suitably selected in accordance with the material and height of the bumps of the electrical element to be connected; however, a size of 1 to 10 μm is preferable when effecting flip-chip mounting of bare IC chips in high densities.

The electroconductive microparticles can be compounded in an amount suitably determined according to surface area of the bumps of the electronic element to be connected, as well as to the surface area of the connecting pads of the wiring board. However, the amount of the electroconductive microparticles is preferably 3 to 30 wt pts per 100 wt pts solid resin content in the anisotropically electroconductive adhesive material pertaining to the present invention because in amounts below this range the electroconductive particles will not come between the upper and lower electrodes, which will cause poor continuity, while in amounts above this range shorts will occur between adjacent electrodes owing to aggregation of the electroconductive particles.

A universally known additive which is compounded with conventional anisotropically electroconductive adhesive materials; e.g., isocyanate-based crosslinking agents, coupling agents such as epoxy silane, epoxy-modified silicone resins, or thermosetting insulating resins such as phenoxy resins, can be added to the anisotropically electroconductive adhesive material pertaining to the present invention as needed.

The anisotropically electroconductive adhesive material pertaining to the present invention can be adjusted by uniformly admixing the aforementioned thermosetting resins and electroconductive particles in toluene or another solvent. The material can be used in the form of a liquid or paste, or made into a thermosetting anisotropically electroconductive adhesive film.

The anisotropically electroconductive adhesive material pertaining to the present invention is preferably suited to anisotropically electroconduction connecting methods wherein connections are achieved between the projecting electrodes of the electronic element and the connecting pads of the wiring board by sandwiching an anisotropically electroconductive adhesive material therebetween, in which electroconductive particles have been dispersed in a thermosetting resin, while applying heat and pressure to the resulting assembly in order to ensure the continuity between the electronic element and the wiring board.

The electronic elements to which the present invention can be applied are elements which have projecting electrodes. Examples of same include bare IC chips and LSI chips. Examples of projecting electrodes include gold and solder bumps, among which nickel bumps are preferably used due to their high hardness and relatively low material cost.

EXAMPLES

The present invention shall be described in further detail by means of the below examples.

The 10% modulus of compressive elasticity (E) of the electroconductive particles (i.e., the K value) shall be determined as described hereinbelow.

Reference Example
(Method for Determining the 10% Modulus of Compressive Elasticity (E) of the Electroconductive Particles (K Value))

Figure 1B:
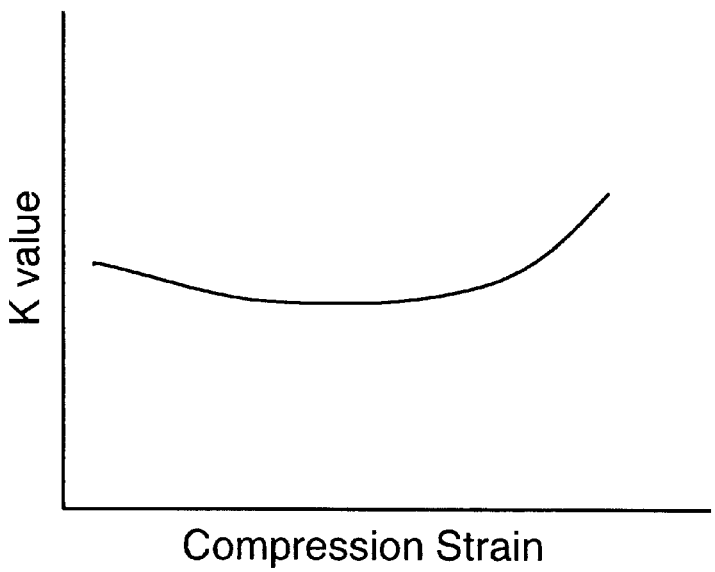

The electroconductive particles are scattered over the smooth surface of a steel plate, and one of the particles is selected. Next, using a powder compression testing machine (PCT-200; Shimazu Co.), the particle is compressed using a 50 μm-diameter diamond cylinder with smooth ends (test load =0.0098N (10 grf); compression rate (constant load rate compression method)=$2.6 \times 10^{-3}$N (0.27 grf)/sec; measuring temperature=20° C). The compression load was electrically detected as an electromagnetic force, and compression displacement was electrically detected as displacement due to differential transformer, with the relationship between compression displacement and load shown in FIG. 1A. From the drawing can be respectively calculated the load value and compression displacement of the electroconductive particles under 10% compression deformation, and from these values and Formula (v), as shown in FIG. 1B, compression strain and the K value (10% modulus of compressive elasticity (E)) can be determined. Compression strain is defined here as the value obtained by dividing the compression displacement by the electroconductive particle size, expressed as a percentage.

Example 1

A thermosetting insulating adhesive formed by admixing 50 wt pts epoxy resin (Epicoat 1009; Yuka Shell Epoxy Co., Ltd.) with 45 wt pts latent curing agent (HX3721; Asahi Kasei (KK)), in which 5 wt pts electroconductive gold-plated spherical nickel particles (Nippon Kagaku Kogyo (KK); mean particle size: 6 μm; 10% modulus of compressive elasticity (E): 41.6 GPa) had been uniformly dispersed, was made into a film, from which a 35 μm-thick anisotropically electroconductive adhesive film was produced.

This anisotropically electroconductive adhesive film was sandwiched between a semiconductor chip (bump material: Ni; bump height: 20 μm; bump surface area: 10,000 μm$^2$; modulus of longitudinal elasticity (E'): 98 GPa; E/E': 0.42; outer dimensions: 6.3 mm square) and a glass epoxy substrate (wiring material: Cu, Ni/Au plating; wiring thickness: 18 μm), and these were connected together by subjecting the assembly to a hot press under conditions of 180° C. and 147N (15 kgf) for 20 sec. The initial continuity resistance per terminal of the resulting connected assembly was 5 to 10 mΩ, which revealed a good connection state. The connected assembly was then subjected to a 100 hr pressure cooker test (PCT) (121° C.; 0.213 MPa (2.1 atm); saturated humidity environment), but there were no large discrepancies revealed between the initial and PCT-final continuity resistance values.

Example 2

The thermosetting insulating adhesive prepared in Example 1 in which 5 wt pts electroconductive gold-plated spherical benzoguanamine resin particles (Nippon Kagaku Kogyo (KK); mean particle size: 5 μm; 10% modulus of compressive elasticity (E): 4.7 GPa; E/E': 0.048) had been uniformly dispersed was made into a film, from which a 35 μm-thick anisotropically electroconductive adhesive film was produced. A connected assembly was obtained in the same manner as in Example 1 by connecting a semiconductor chip and a glass epoxy substrate via the anisotropically electroconductive adhesive film. The initial continuity resistance per terminal of the resulting connected assembly was 5 to 10 mΩ, which revealed a good connection state. The connected assembly was then subjected to a 100 hr pressure cooker test (PCT) (121° C.; 0.213 MPa (2.1 atm); saturated humidity environment), but there were no large discrepancies revealed between the initial and PCT-final continuity resistance values.

Example 3

The thermosetting insulating adhesive prepared in Example 1 in which 5 wt pts electroconductive particles obtained by covering spherical benzoguanamine resin particles with silica and then performing a gold-plating treatment thereon (Nippon Kagaku Kogyo (KK); mean particle size: 7 μm; 10% modulus of compressive elasticity (E) 21.6 GPa; E/E': 0.22) had been uniformly dispersed was made into a film, from which a 35 μm-thick anisotropically electroconductive adhesive film was produced. A connected assembly was obtained in the same manner as in Example 1 by connecting a semiconductor chip and a glass epoxy substrate via the anisotropically electroconductive adhesive film. The initial continuity resistance per terminal of the resulting connected assembly was 5 to 10 mΩ, which revealed a good connection state. The connected assembly was then subjected to a 100 hr pressure cooker test (PCT) (121° C.; 0.213 MPa (2.1 atm); saturated humidity environment), but there were no large discrepancies revealed between the initial and PCT-final continuity resistance values.

Comparative Example 1

The thermosetting insulating adhesive prepared in Example 1 in which 5 wt pts electroconductive gold-plated spherical polystyrene resin particles (Nippon Kagaku Kogyo (KK); mean particle size: 5 μm; 10% modulus of compressive elasticity (E): 1.5 GPa; E/E': 0.015) had been uniformly dispersed was made into a film, from which a 35 μm-thick anisotropically electroconductive adhesive film was produced. When an assembly was about to be connected in the same manner as in Example 1 by connecting a semiconductor chip and a glass epoxy substrate via the anisotropically electroconductive adhesive film, the electroconductive particles sandwiched between the electrodes were crushed (i.e., the electroconductive particles were destroyed), but the initial continuity resistance per terminal of the resulting connected assembly was 5 to 10 mΩ. The connected assembly was then subjected to a 100 hr pressure cooker test (PCT) (121° C.; 0.213 MPa (2.1 atm); saturated humidity environment), but the PCT-final continuity resistance values had risen sharply from the initial continuity resistance values, leading to a markedly diminished connection reliability.

Comparative Example 2

The anisotropically electroconductive adhesive film prepared in Example 1 was sandwiched between a semiconductor chip (bump material: Au; bump height: 20 μm; bump surface area: 10,000 μm; modulus of longitudinal elasticity (E'): 76.4 GPa; E/E': 0.54; outer dimensions: 6.3 mm square) and a glass epoxy substrate (wiring material: Cu, Ni/Au plating; wiring thickness: 18 μm), and these were connected together by subjecting the assembly to a hot press under conditions of 180° C. and 147N (15 kgf) for 20 sec. The initial continuity resistance per terminal of the resulting connected assembly was 5 to 10 mΩ, which revealed a good connection state. The connected assembly was then subjected to a 100 hr pressure cooker test (PCT) (121° C.; 0.213 MPa (2.1 atm); saturated humidity environment), but the PCT-final continuity resistance values had risen sharply from the initial continuity resistance values, leading to a markedly diminished connection reliability.

According to the anisotropically electroconductive adhesive material pertaining to the present invention, it is possible to ensure the same connection reliability observed in conventional anisotropically electroconductive connections in which gold or solder bumps are employed when bare IC chips or other electronic elements which have been furnished with projecting electrodes are brought into anisotropically electroconductive connection with the connecting pads of a wiring board, even when nickel or other relatively hard bumps are used as the projecting electrodes.

The entire disclosure of the specification, summary, claims and drawings of Japanese Patent Application No. 2000-99883 filed on Mar. 31, 2000 is hereby incorporated by reference.

What is claimed is:

1. An anisotropically electroconductive adhesive material, comprising a thermosetting resin said resin selected from the group consisting of epoxy, urethane and unsaturated polyester resins, and electroconductive particles dispersed in the thermosetting resin, said particles selected from the group consisting of metallic particles, metal covered resin particles, and complex particles in which an inorganic powder is bonded to a resin core and coated with a metal plating, wherein a 10% modulus of compressive elasticity (E) in said electroconductive particles and a modulus of longitudinal elasticity (E') of projecting electrodes of an electronic element to be connected by said anisotropically electroconductive adhesive material satisfy the below Relational Formula (1)

$$0.02 \leq E/E' \leq 0.5 \qquad (1).$$

2. The anisotropically electroconductive adhesive material according to claim 1, wherein the mean particle size of said electroconductive particles is 1 to 10 μm.

3. The anisotropically electroconductive adhesive material according to claim 1, wherein said projecting electrodes of said electronic element are made of nickel.

4. A connecting method, comprising sandwiching an anisotropically electroconductive adhesive material, in which electroconductive particles have been dispersed in a thermosetting resin, between projecting electrodes of an electronic element and the connecting pads of a wiring board, said particles selected from the group consisting of metallic particles, metal covered resin particles, and complex particles in which an inorganic powder is bonded to a resin core and coated with a metal plating and said thermosetting resin selected from the group consisting of epoxy, urethane and unsaturated polyester resins, and applying heat and pressure thereto to make a connection therebetween while ensuring continuity between the electrical element and the wiring board, wherein, in the anisotropically electroconductive adhesive material, a 10% modulus of compressive elasticity (E) in the electroconductive particles and a modulus of longitudinal elasticity (E') of the projecting electrodes of the electronic element that satisfy the Relational Formula (1) below $$0.02 \leq E/E' \leq 0.5 \qquad (1).$$

5. The anisotropically electroconductive adhesive material according to claim 2, wherein said projecting electrodes of said electronic element are made of nickel.

* * * * *